United States Patent
Yamaguchi et al.

(10) Patent No.: US 9,414,517 B2
(45) Date of Patent: Aug. 9, 2016

(54) ELECTRONIC DEVICE

(71) Applicant: FUJITSU LIMITED, Kawasaki-shi, Kanagawa (JP)

(72) Inventors: Goki Yamaguchi, Kawasaki (JP); Sonomasa Kobayashi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 201 days.

(21) Appl. No.: 13/964,517

(22) Filed: Aug. 12, 2013

(65) Prior Publication Data

US 2014/0092554 A1    Apr. 3, 2014

(30) Foreign Application Priority Data

Sep. 28, 2012   (JP) .................. 2012-218432

(51) Int. Cl.
    *H05K 7/20*   (2006.01)
    *G06F 1/20*   (2006.01)
(52) U.S. Cl.
    CPC ............ *H05K 7/20172* (2013.01); *G06F 1/203* (2013.01)
(58) Field of Classification Search
    CPC .................................. H05L 7/20172
    USPC .......... 361/679.46–679.54, 688–723
    See application file for complete search history.

(56) References Cited

U.S. PATENT DOCUMENTS

| | | | | |
|---|---|---|---|---|
| 5,459,348 A | * | 10/1995 | Smith ............................ | 257/659 |
| 5,548,084 A | * | 8/1996 | Tracy ............................ | 174/381 |
| 5,581,443 A | * | 12/1996 | Nakamura et al. ............. | 361/705 |
| 5,810,554 A | * | 9/1998 | Yokozawa et al. ............. | 415/176 |
| 5,923,530 A | * | 7/1999 | Murayama et al. ......... | 361/679.09 |
| 6,049,455 A | * | 4/2000 | Nakamura et al. ............ | 361/688 |
| 6,407,921 B1 | * | 6/2002 | Nakamura et al. ............ | 361/700 |
| 7,172,390 B2 | * | 2/2007 | Lu et al. ...................... | 415/213.1 |
| 7,474,526 B2 | * | 1/2009 | Fujiwara .................. | 361/679.52 |
| 7,652,883 B2 | * | 1/2010 | Chikazawa et al. ........... | 361/695 |
| 7,672,123 B2 | * | 3/2010 | Tatsukami ............... | 361/679.54 |
| 7,697,288 B2 | * | 4/2010 | Okutsu ........................ | 361/695 |
| 7,924,563 B2 | * | 4/2011 | Kobayashi et al. ........... | 361/695 |
| 7,954,541 B2 | * | 6/2011 | Wang et al. .................. | 165/80.3 |
| 7,961,468 B2 | * | 6/2011 | Takakusaki et al. .......... | 361/700 |
| 8,085,535 B2 | * | 12/2011 | Wikander et al. ............ | 361/695 |
| 8,379,383 B2 | * | 2/2013 | Sugiura et al. ........... | 361/679.47 |
| 8,625,279 B2 | * | 1/2014 | Hata et al. .................... | 361/697 |

(Continued)

FOREIGN PATENT DOCUMENTS

| | | |
|---|---|---|
| JP | 2000-77877 A | 3/2000 |
| JP | 2000-216575 A | 8/2000 |

(Continued)

OTHER PUBLICATIONS

Office Action dated May 17, 2016, issued in Japanese Patent Application No. 2012-218432, with partial English translation. (5 pages).

*Primary Examiner* — David M Sinclair
*Assistant Examiner* — Robert Brown
(74) *Attorney, Agent, or Firm* — Westerman, Hattori, Daniels & Adrian, LLP

(57) ABSTRACT

An electronic device comprises an enclosure, an air blower disposed within the enclosure, an air blower mounting member for mounting the air blower within the enclosure, and a card holder that is disposed using part of the air blower mounting member so as to overlap with the air blower mounting member in the thickness direction and that holds a card.

11 Claims, 9 Drawing Sheets

(56) References Cited

U.S. PATENT DOCUMENTS

| | | |
|---|---|---|
| 2001/0023591 A1 | 9/2001 | Maeda et al. |
| 2003/0016496 A1* | 1/2003 | Kim et al. ............... 361/695 |
| 2005/0207113 A1* | 9/2005 | Tanaka et al. ............ 361/687 |
| 2005/0215098 A1* | 9/2005 | Muramatsu et al. ......... 439/159 |
| 2006/0133048 A1* | 6/2006 | Kobayashi et al. .......... 361/720 |
| 2007/0006996 A1* | 1/2007 | Mikubo et al. .......... 165/104.33 |
| 2007/0131383 A1* | 6/2007 | Hattori et al. ............. 165/11.2 |
| 2007/0146988 A1* | 6/2007 | Yamagishi et al. .......... 361/687 |
| 2008/0019093 A1* | 1/2008 | Hongo ..................... 361/693 |
| 2008/0043429 A1* | 2/2008 | Tatsukami ................ 361/687 |
| 2008/0153345 A1* | 6/2008 | Chen et al. ............... 439/485 |
| 2008/0318446 A1* | 12/2008 | Clancy et al. ............. 439/76.1 |
| 2009/0078396 A1* | 3/2009 | Bhatti et al. .......... 165/104.33 |
| 2009/0129020 A1* | 5/2009 | Fujiwara ................. 361/697 |
| 2009/0147477 A1* | 6/2009 | Chao et al. ............... 361/697 |
| 2010/0073853 A1* | 3/2010 | Suzuki ................. 361/679.01 |
| 2010/0142148 A1* | 6/2010 | Nitta et al. ............... 361/699 |
| 2010/0238628 A1* | 9/2010 | Hung et al. ............... 361/697 |
| 2010/0309624 A1* | 12/2010 | Yeh ........................ G06F 1/20 361/679.48 |
| 2011/0080710 A1* | 4/2011 | Sugiura et al. ............. 361/697 |
| 2011/0092087 A1* | 4/2011 | Jung .................. H01R 12/7005 439/159 |
| 2011/0292560 A1* | 12/2011 | Jewell-Larsen et al. ...... 361/231 |
| 2012/0106082 A1* | 5/2012 | Wu et al. ................. 361/697 |
| 2012/0155010 A1* | 6/2012 | Yamaguchi ............. 361/679.33 |
| 2012/0170207 A1* | 7/2012 | Li ...................... 361/679.47 |
| 2013/0235520 A1* | 9/2013 | Huang .................. 361/679.48 |
| 2013/0235548 A1* | 9/2013 | Chang .................... 361/810 |
| 2013/0280939 A1* | 10/2013 | Chang et al. .............. 439/325 |
| 2013/0285506 A1* | 10/2013 | Takeda ................. H02N 2/001 310/317 |

FOREIGN PATENT DOCUMENTS

| | | |
|---|---|---|
| JP | 2001-282396 A | 10/2001 |
| JP | 2004-326457 A | 11/2004 |
| JP | 2008-266858 A | 11/2008 |

\* cited by examiner

ELECTRONIC DEVICE

CROSS-REFERENCE TO RELATED APPLICATION

This application is based upon and claims the benefit of priority of the prior Japanese Patent Application No. 2012-218432, filed on Sep. 28, 2012, the entire contents of which are incorporated herein by reference.

FIELD

The embodiment discussed herein is related to an electronic device.

BACKGROUND

Electronic devices such as computers sometimes have, within their enclosures, an air blower. The air blower is sometimes mounted within the enclosure using a mounting member.

A related art is disclosed in Japanese Laid-open Patent Publication No. 2000-216575.

When such an electronic device is provided with a card holder that holds a card, and if, for example, the air blower mounting member and the card holder are arranged simply one on top of the other, the thickness of the enclosure of the electronic device has to be increased. If the air blower mounting member and the card holder are arranged in the width direction or the depth direction of the enclosure, the width or depth of the enclosure of the electronic device increases.

It is an object of the present disclosure to allow an air blower and a card holder to coexist while keeping an enclosure of an electronic device from increasing in size.

SUMMARY

According to an aspect of the embodiment, an apparatus includes an electronic device comprises an enclosure, an air blower disposed within the enclosure, an air blower mounting member for mounting the air blower within the enclosure, and a card holder that is disposed using part of the air blower mounting member so as to overlap with the air blower mounting member in the thickness direction and that holds a card.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

A first embodiment is described with reference to the drawings in detail.

Figure 1:
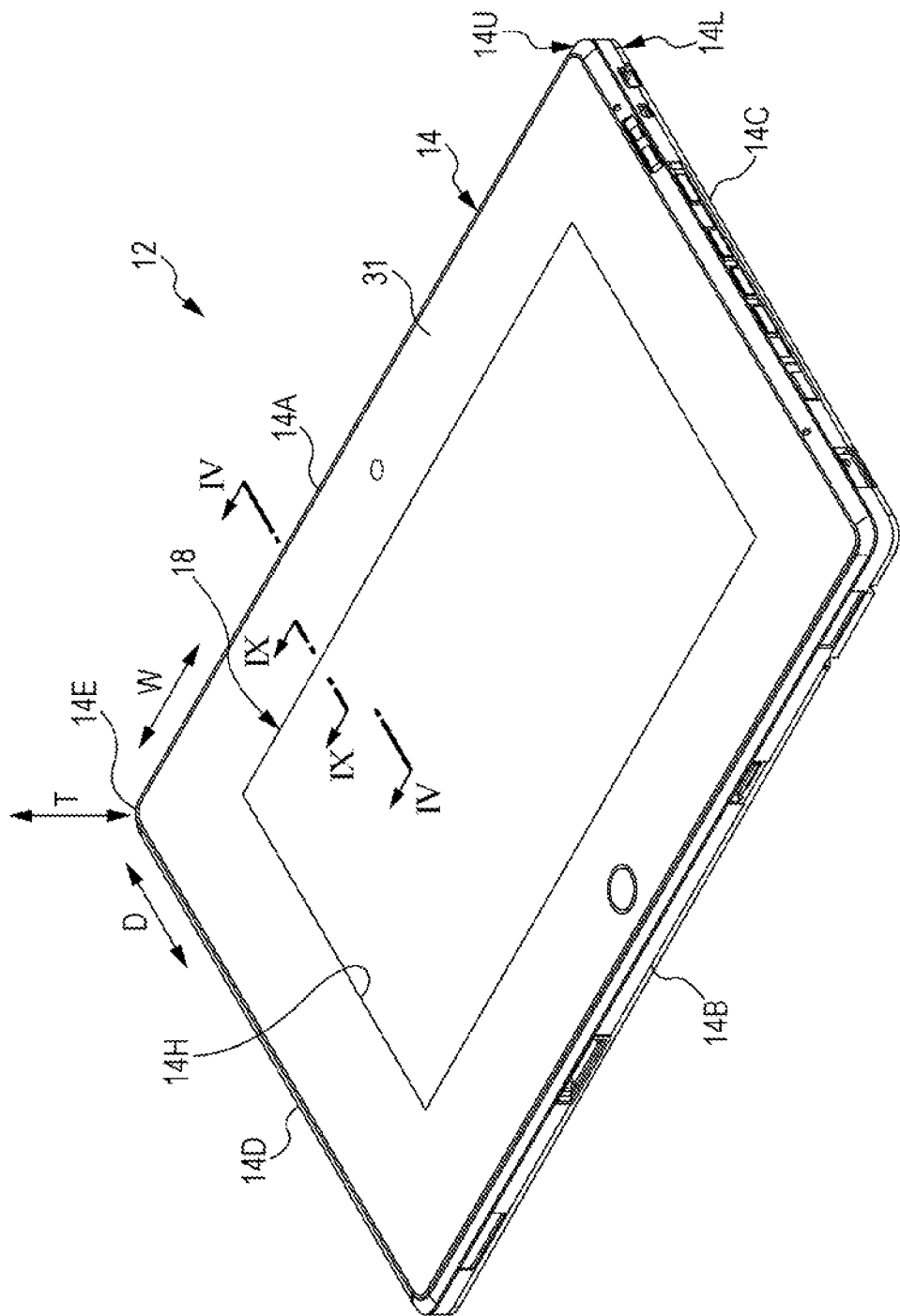
FIG. 1 is a perspective view illustrating a mobile computer of a first embodiment.

As illustrated in FIG. 1, in the first embodiment, a mobile computer 12 is taken as an example of an electronic device.

The mobile computer 12 has an enclosure 14. The enclosure 14 is formed, for example, in a flattened box shape. In plan view (view from the direction of arrow A), the enclosure 14 is formed in a substantially rectangular shape having a back side 14A, a front side 14B, a right side 14C, and a left side 14D.

Hereinafter, in the drawings, the width direction, depth direction, and thickness direction of the mobile computer 12 (enclosure 14) are indicated by arrow W, arrow D, and arrow T, respectively. This thickness direction corresponds to the thickness direction of an air blower 26, an air blower mounting member 24, and a card 56 (held in a card holder 54) to be described later. However, these directions are used for convenience in the following description, and are changed according to the status of use of the mobile computer 12. For example, the mobile computer 12 may be used in portrait orientation so that the direction of arrow D is the width direction during use.

Figure 2:
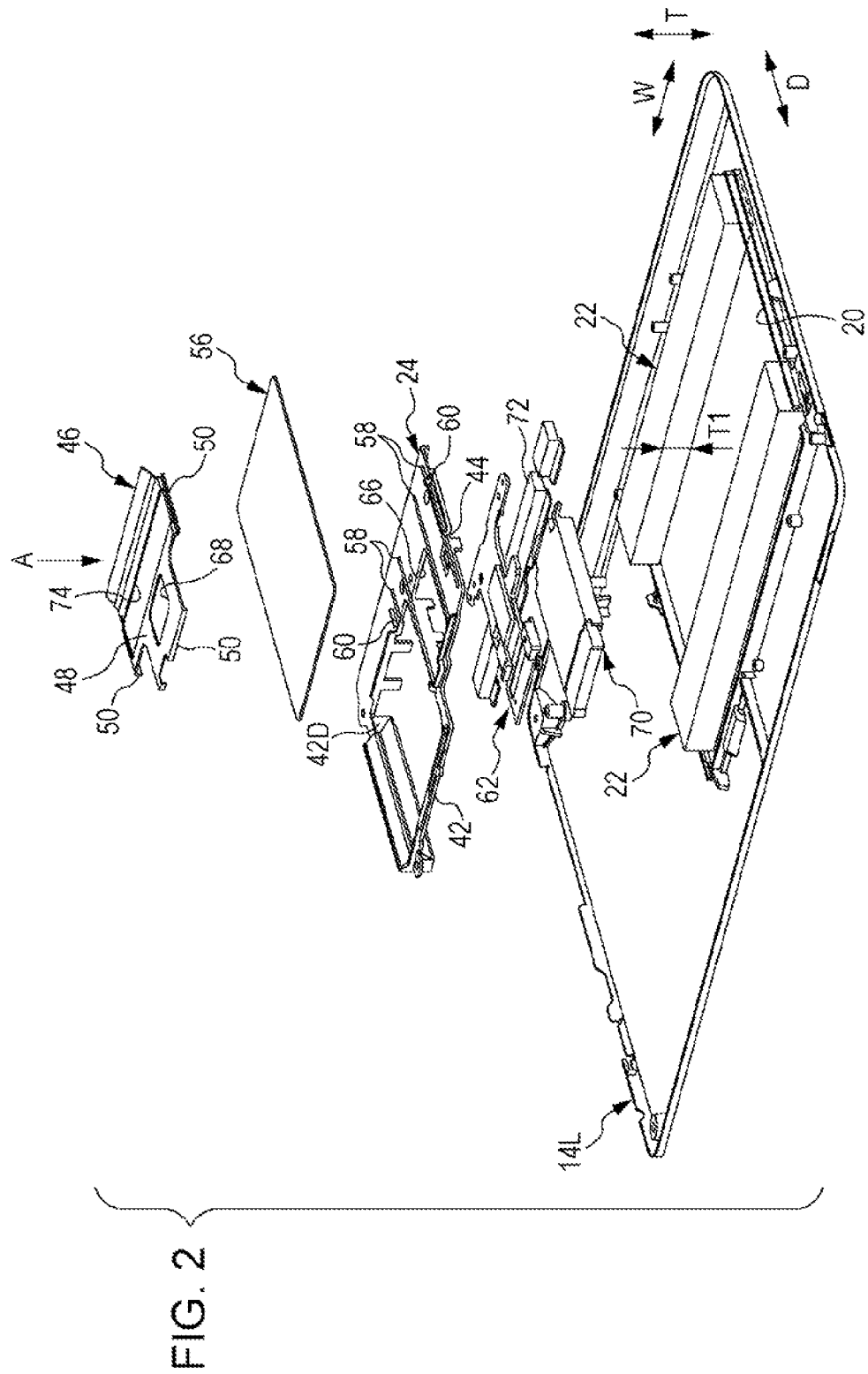
FIG. 2 is an exploded perspective view illustrating part of the internal structure of the mobile computer of the first embodiment.

The enclosure 14 of this embodiment is divided in the thickness direction (direction of arrow T) and has an upper member 14U and a lower member 14L. The upper member 14U and the lower member 14L, superimposed on each other, are engaged with each other using engagement members (or fastened together with fastening members such as screws). In FIG. 2, the depiction of the upper member 14U is omitted.

Within the enclosure 14, and in a position near the upper member 14U, a display 18 is provided. The content displayed on the display 18 may be viewed through a display opening 14H of the upper member 14U. In addition, various input operations may be performed by the operator by touching the display 18 directly, or indirectly using a stylus pen or the like. Attached to the upper member 14U is a light-transmissive cover member 31 that covers the display 18 and part of the upper member 14U around it.

As illustrated in FIG. 2, the lower member 14L has a battery receiving hole 20 formed therein. The battery receiving hole 20 receives a battery 22 thicker than the lower member 14L. Although the battery 22 is thicker than the lower member 14L as described above, the battery 22 does not protrude toward the outside of the enclosure 14 (downward from the lower member 14L) and protrudes toward the inside of the enclosure 14 (upward from the lower member 14L in FIG. 2).

Within the enclosure 14, an air blower mounting member 24 is provided. An air blower 26 (see FIG. 3) is mounted within the enclosure 14 with the air blower mounting member 24.

In this embodiment, the air blower 26 is disposed in the vicinity of the corner 14E between the back side 14A and the left side 14D of the enclosure 14. The air blower 26 is held in a predetermined position by the air blower mounting member 24, and is fixed to the lower member 14L, a board 16 (see FIG. 4), or a member for mounting within the enclosure 14, with screws or the like. The board 16 may be a mother board or a board other than a mother board.

The type of the air blower 26 is not particularly limited as long as it may cool a heat radiation member 28 by blowing air to the heat radiation member 28. In this embodiment, a centrifugal air blower is used as the air blower 26. The air blower 26 has, in an air blower housing 32 having a flattened rectangular parallelepiped shape, a plurality of rotary vanes 36 (see FIG. 3) that rotate about a rotation axis 34. On both sides of the rotary vanes 36 are side plates 38 (parts of the air blower housing 32) normal to the rotation axis 34. The side plates 38 each have a plurality of (three in the example illustrated in FIG. 3) air inlets 40 formed therein. By the rotation of the rotary vanes 36, air is taken in through the air inlets 40, and air is expelled in the direction of arrow R1 including a component in a centrifugal direction.

The air blower mounting member 24 has a substantially rectangular frame portion 42 that surrounds the air blower 26 in plan view (view from the direction of arrow A), and a substantially plate-like extended plate portion 44 that is extended from the frame portion 42 to the inner side, in the width direction, of the enclosure 14.

A heat radiation member 28 is disposed between the frame portion 42 and the left side 14D of the enclosure 14. The heat radiation member 28 has a plurality of heat radiation fins arranged in the depth direction of the enclosure 14 (direction of arrow D) at regular intervals. In this embodiment, the longitudinal direction of the heat radiation member 28 corresponds to the depth direction of the enclosure 14. Heat from various heat-generating members (for example, electronic components such as semiconductor chips) of the mobile computer 12 is transferred to the heat radiation fins.

In part of the frame portion 42 facing the heat radiation member 28, a duct portion 42D that penetrates the frame portion 42 from the inside (the air blower 26 side) to the outside of the frame portion 42 is formed. The duct portion 42D has an opening width W1 (see FIG. 7) about equal to the length L1 of the heat radiation member 28. The air blown from an air outlet 26H of the air blower 26 enters the duct portion 42D and is then spread in the duct portion 42D in the width direction of the duct portion 42D (in the same direction as arrow D in this embodiment). That is, although the width of the air outlet 26H is less than the length L1 of the heat radiation member 28, air from the air blower 26 is dispersed by the duct portion 42D in the longitudinal direction of the heat radiation member 28. Thus, in the direction in which the heat radiation fins are arranged, the amount of air acting on each of the heat radiation fins is equalized (however, it does not have to be strictly equalized).

Figure 3:
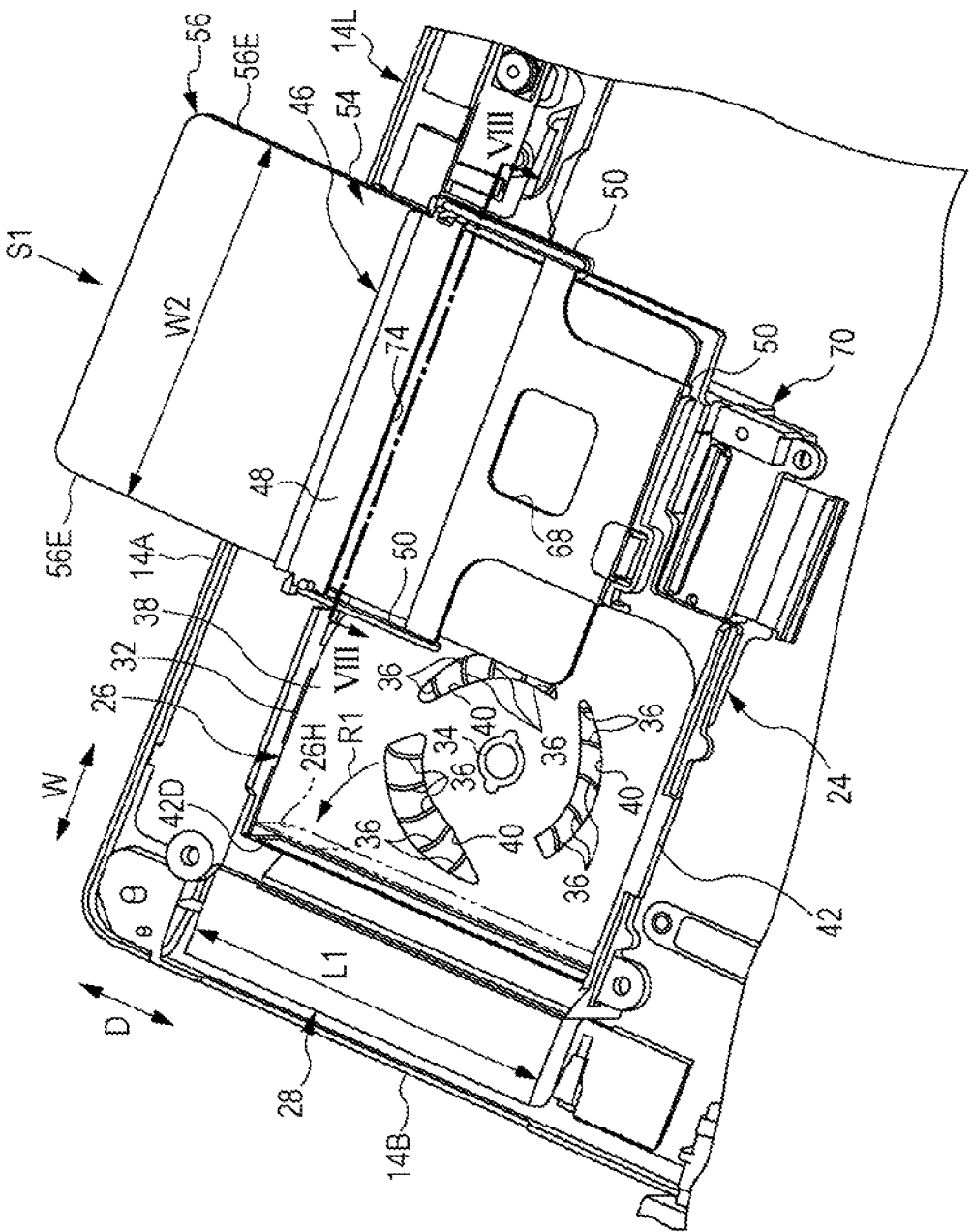
FIG. 3 is an enlarged partial perspective view of the internal structure of the mobile computer of the first embodiment.
Figure 5:
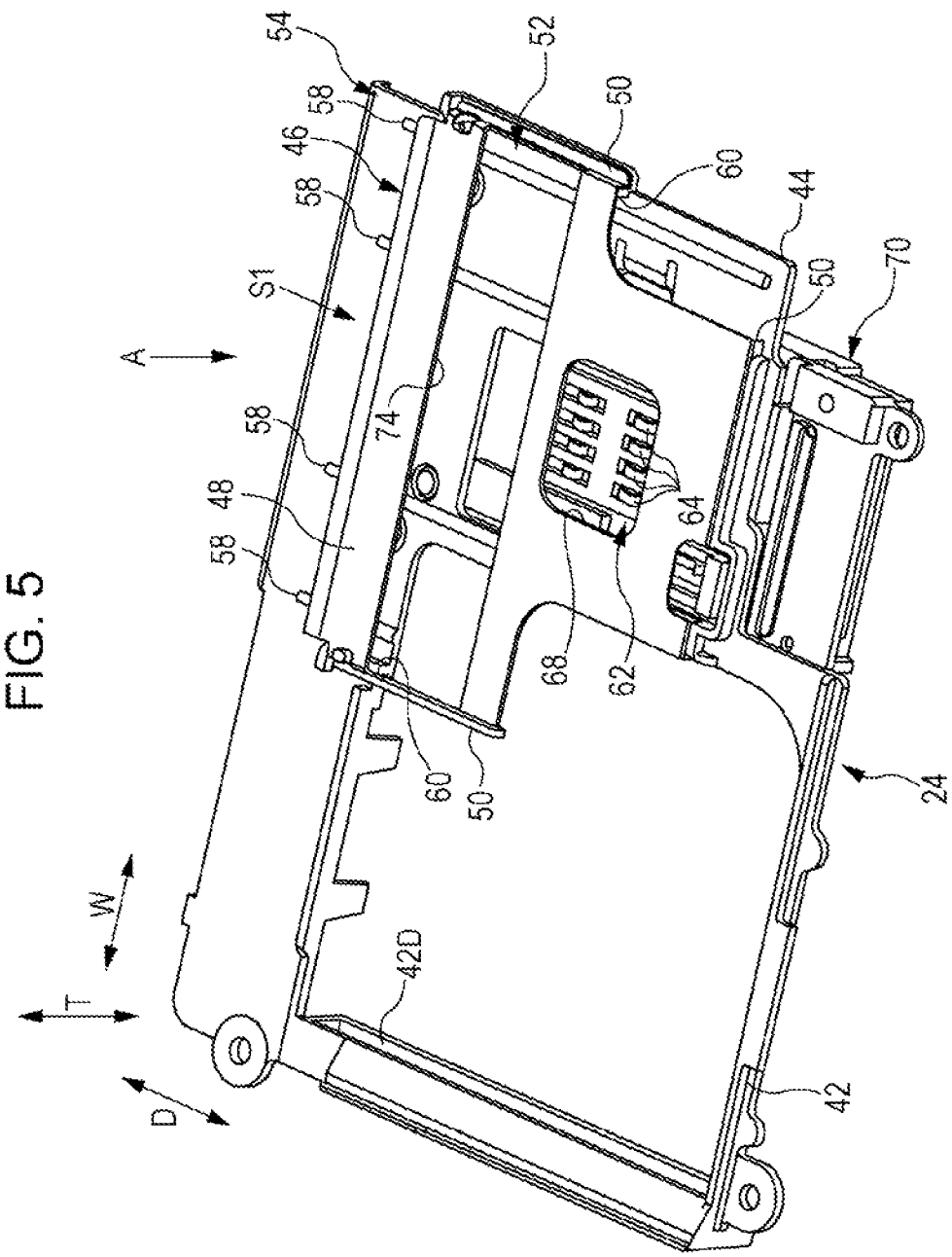
FIG. 5 is a perspective view illustrating a card holder of the mobile computer of the first embodiment.

A holder member 46 is attached to the air blower mounting member 24 so as to be located between the air blower mounting member 24 and the upper member 14U of the enclosure 14. As illustrated in FIG. 3 and FIG. 5, the holder member 46 has a substantially rectangular holder main body portion 48, and attachment leg portions 50 extended from predetermined positions of the holder main body portion 48 toward the air blower mounting member 24. By engaging the attachment leg portions 50 with engagement members of the air blower mounting member 24, the holder member 46 is attached to the air blower mounting member 24.

When the holder member 46 is attached to the air blower mounting member 24, as can be seen in FIG. 3 and FIG. 5, the holder main body portion 48 of the holder member 46 overlaps with the air blower mounting member 24 in the thickness direction (when viewed from the direction of arrow A). The holder main body portion 48 of the holder member 46 and the air blower mounting member 24 are parallel to each other, and they form therebetween a card holding portion 52 (see FIG. 9). That is, in this embodiment, the card holder 54 is disposed using part of the air blower mounting member 24 and the holder member 46 so as to overlap with the air blower mounting member 24 in the thickness direction. In other words, part of the air blower mounting member 24 doubles as the card holder 54 is disposed.

As illustrated in FIG. 3, the card holding portion is open on the back side 14A side of the enclosure 14, and the card 56 may be inserted through the open portion in the direction of arrow S1. The card holding portion 52 does not have to accommodate the whole of the card 56. In FIG. 3, the card holding portion 52 accommodates part of the card 56. The card 56 is a member inserted into the mobile computer 12 (electronic device), and does not have to be an important component of the mobile computer 12 (electronic device).

In this embodiment, the card holder 54 is positioned in such a manner that part of the card 56 held in the card holding portion 52 overlaps with part of the air blower 26 in plan view (view from the direction of arrow A). Although the card 56 overlaps with the air blower 26, the card 56 does not overlap with any of the air inlets 40 or overlaps only with part of one of the air inlets 40 in plan view. In the example illustrated in FIG. 3, the card 56 overlaps only with the right part of the back right one of the three air inlets 40 in plan view.

Figure 4:
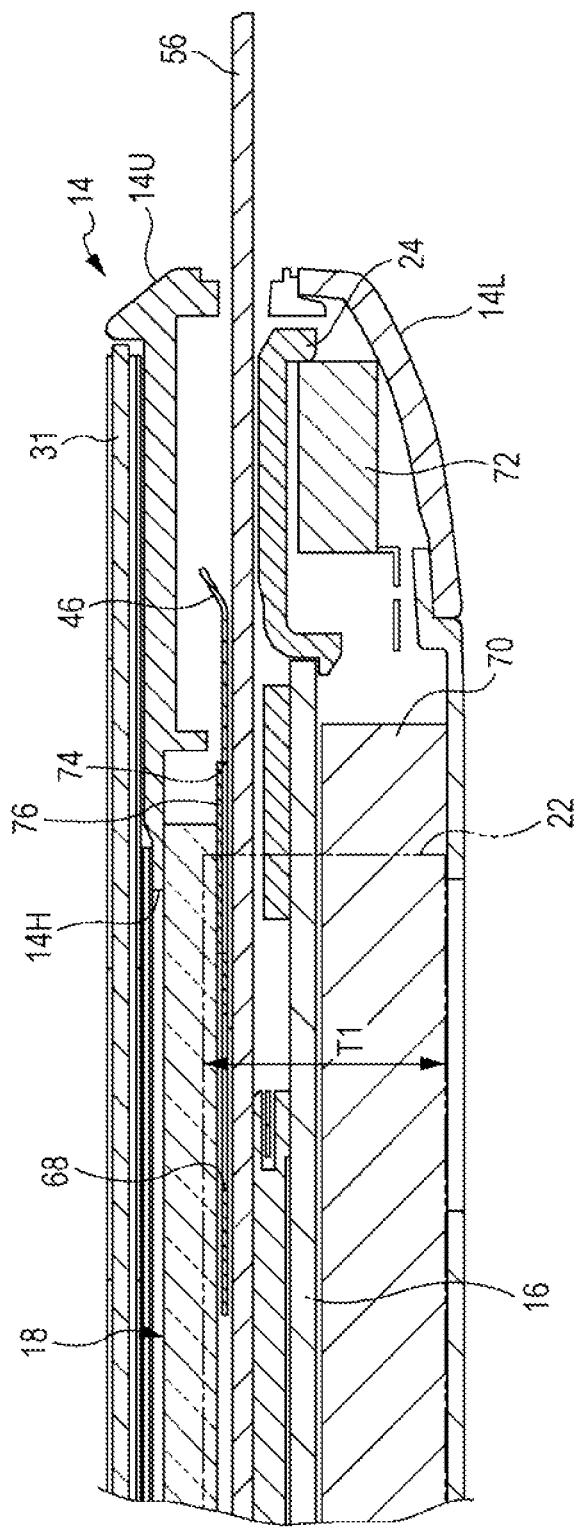
FIG. 4 is a sectional view of the mobile computer of the first embodiment taken along line IV-IV of FIG. 1.

In addition, in this embodiment, the card holder 54 is positioned in such a manner that the card 56 held in the card holding portion does not overlap with the battery 22 in plan view (view from the direction of arrow A). As can be seen in FIG. 4, the card 56 is held in the card holding portion so as to be located within the range of the thickness T1 of the battery 22.

Figure 7:
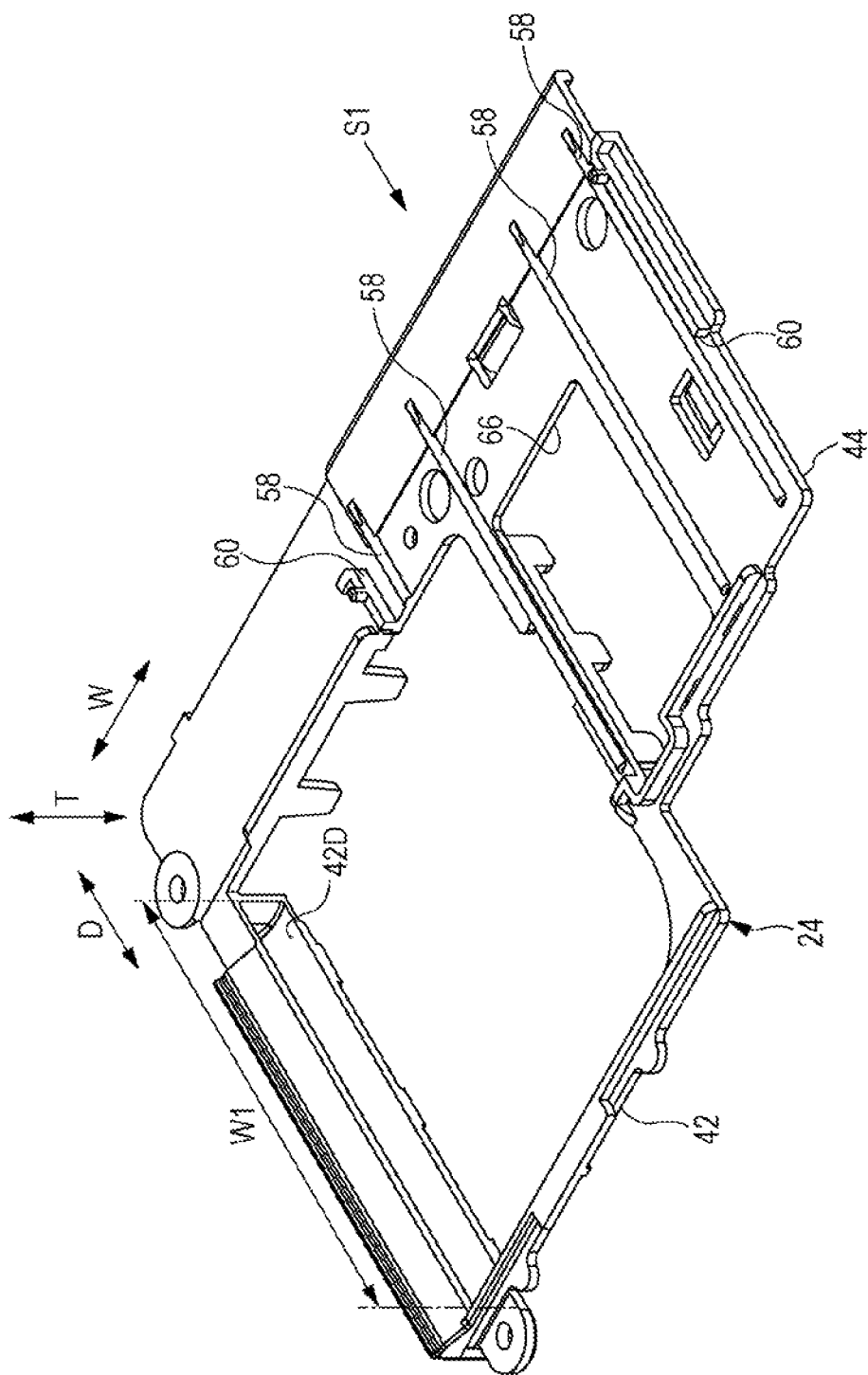
FIG. 7 is a perspective view illustrating an air blower mounting member of the mobile computer of the first embodiment.
Figure 8:
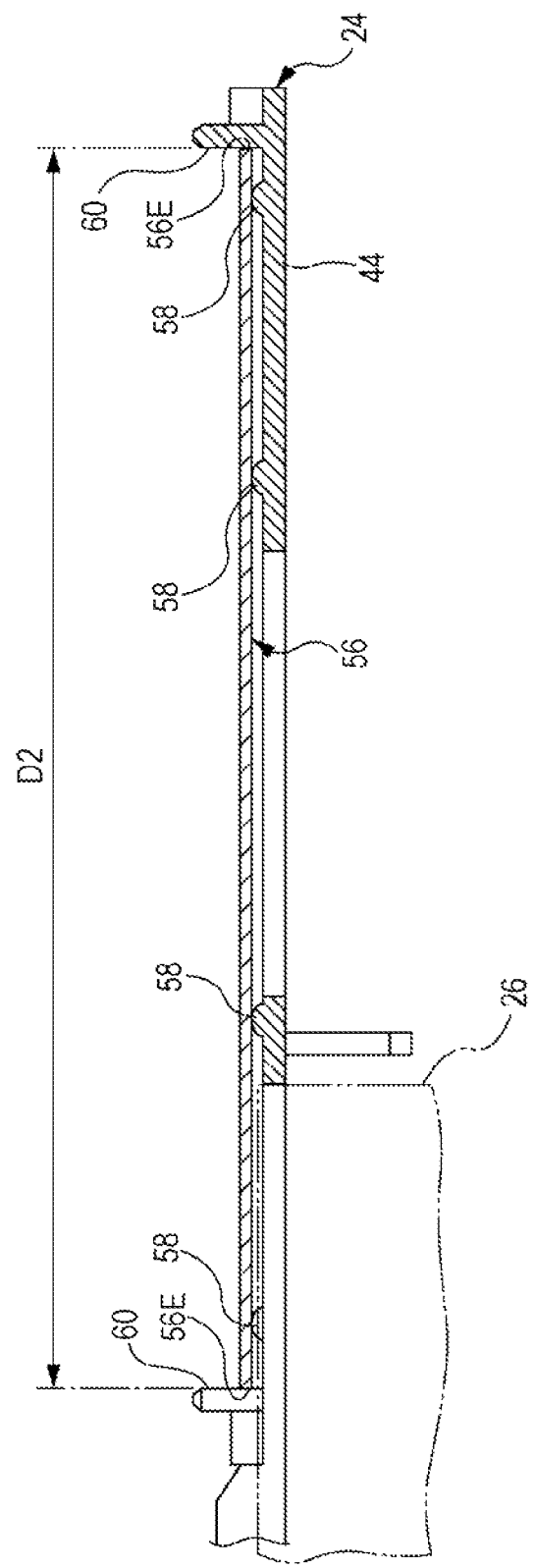
FIG. 8 is an enlarged partial sectional view of the internal structure of the mobile computer of the first embodiment taken along line VIII-VIII of FIG. 3.

As illustrated in FIG. 7 and FIG. 8, the air blower mounting member 24 has one or a plurality of (four in the example illustrated in FIG. 7 and FIG. 8) elongated protrusions 58 formed thereon and facing the card 56 held in the card holding portion 52. The elongated protrusions 58 support the card 56 from below in such a manner that the card 56 held in the card holding portion 52 is not in contact with the air blower 26. The elongated protrusions 58 also function as ribs that reinforce the extended plate portion 44. In this embodiment, the elongated protrusions 58 are formed along the direction of insertion of the card 56 into the card holding portion 52 (direction of arrow S1), so that the front edge of the card 56 does not accidentally hit the elongated protrusions 58 when the card 56 is inserted.

The air blower mounting member 24 has a pair of guide walls 60 formed thereon. The guide walls 60 face the side edges 56E of the card 56 held in the card holding portion 52. The distance D2 between the opposed surfaces of the guide walls 60 is slightly greater than the width W2 of the card 56 (see FIG. 3). The guide walls 60 suppress the movement in the width direction of the card 56 being inserted into the card holding portion 52, and guide the card 56 so that the card 56 may be smoothly inserted.

Figure 6:
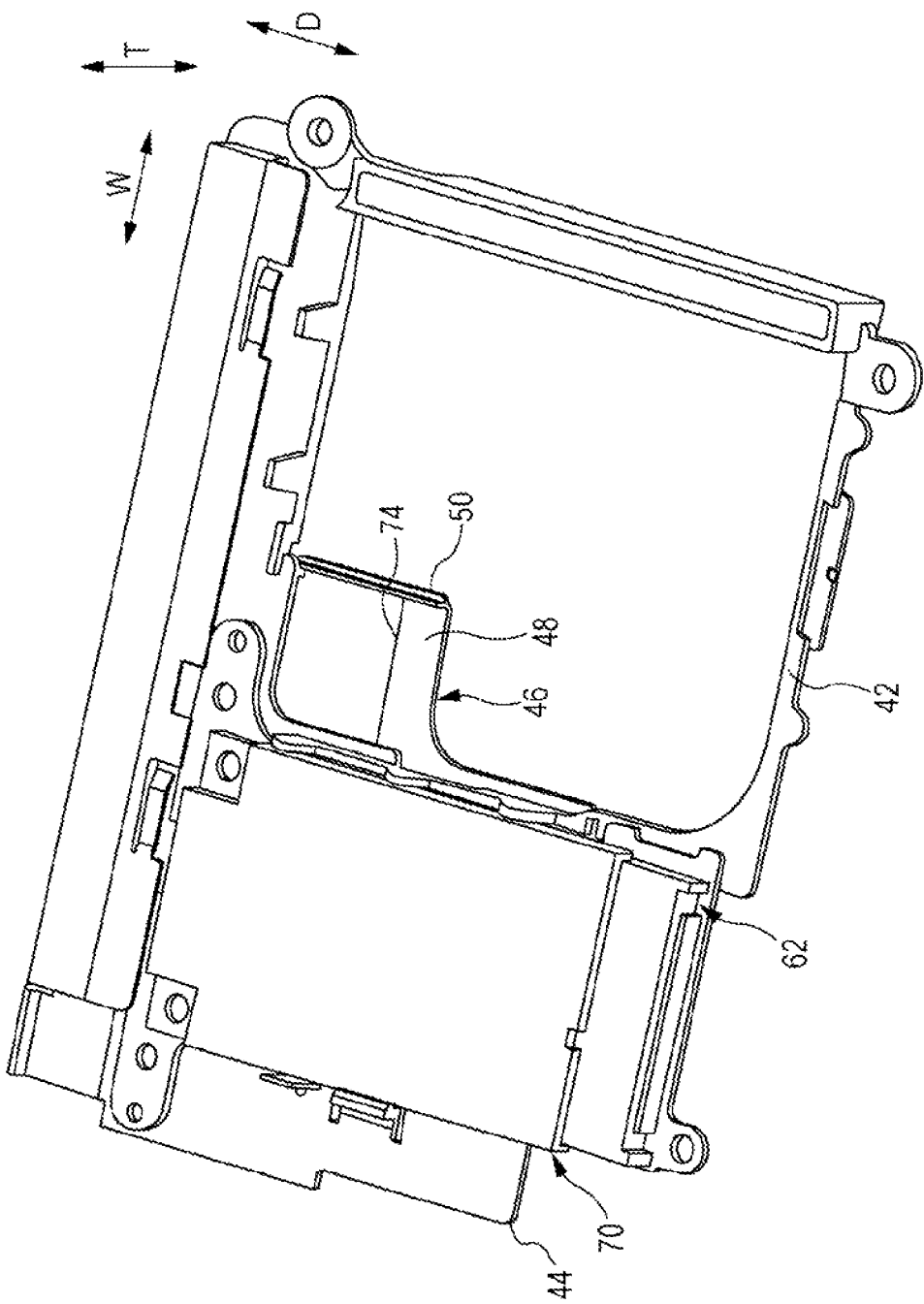
FIG. 6 is a perspective view illustrating the card holder of the mobile computer of the first embodiment.

As illustrated in FIG. 5 and FIG. 6, a card input and output board 62 is attached to the surface of the extended plate portion 44 of the air blower mounting member 24 opposite to the holder member 46 (the lower surface of the extended plate portion 44 in FIG. 5).

The card input and output board 62 is an example of a terminal member. Terminals 64 are provided on the surface of the card input and output board 62 closest to the card holding portion 52. Part of each of the terminals 64 protrudes through a through-hole 66 formed in the air blower mounting member 24 (see FIG. 2 and FIG. 7) into the card holding portion 52, and is in contact with a contact portion of the card 56 held in the card holding portion 52. Thus, electrical signals may be transmitted and received between the card 56 and the card input and output board 62.

As illustrated in FIG. 2 and FIG. 5, a contact avoidance hole 68 is formed in the holder main body portion 48 of the holder member 46 and in a position corresponding to the terminals 64 in plan view. The contact avoidance hole 68 avoids the terminals 64 so that the terminals 64 do not accidentally come into contact with the holder member 46 when the card 56 is not held in the card holding portion 52.

A communication module member 70 is attached to the air blower mounting member 24 so as to be located under the card input and output board 62 (in such a manner that the card input and output board 62 is located between the air blower mounting member 24 and the communication module member 70). In addition, an antenna 72 is disposed closer to the back side 14A than the communication module member 70. The mobile computer 12 may transmit and receive radio waves to and from an external device or the like through the communication module member 70, using the antenna 72.

The card input and output board 62 and the communication module member 70 are attached to and integrated with the air blower mounting member 24 with screws or the like.

Figure 9:
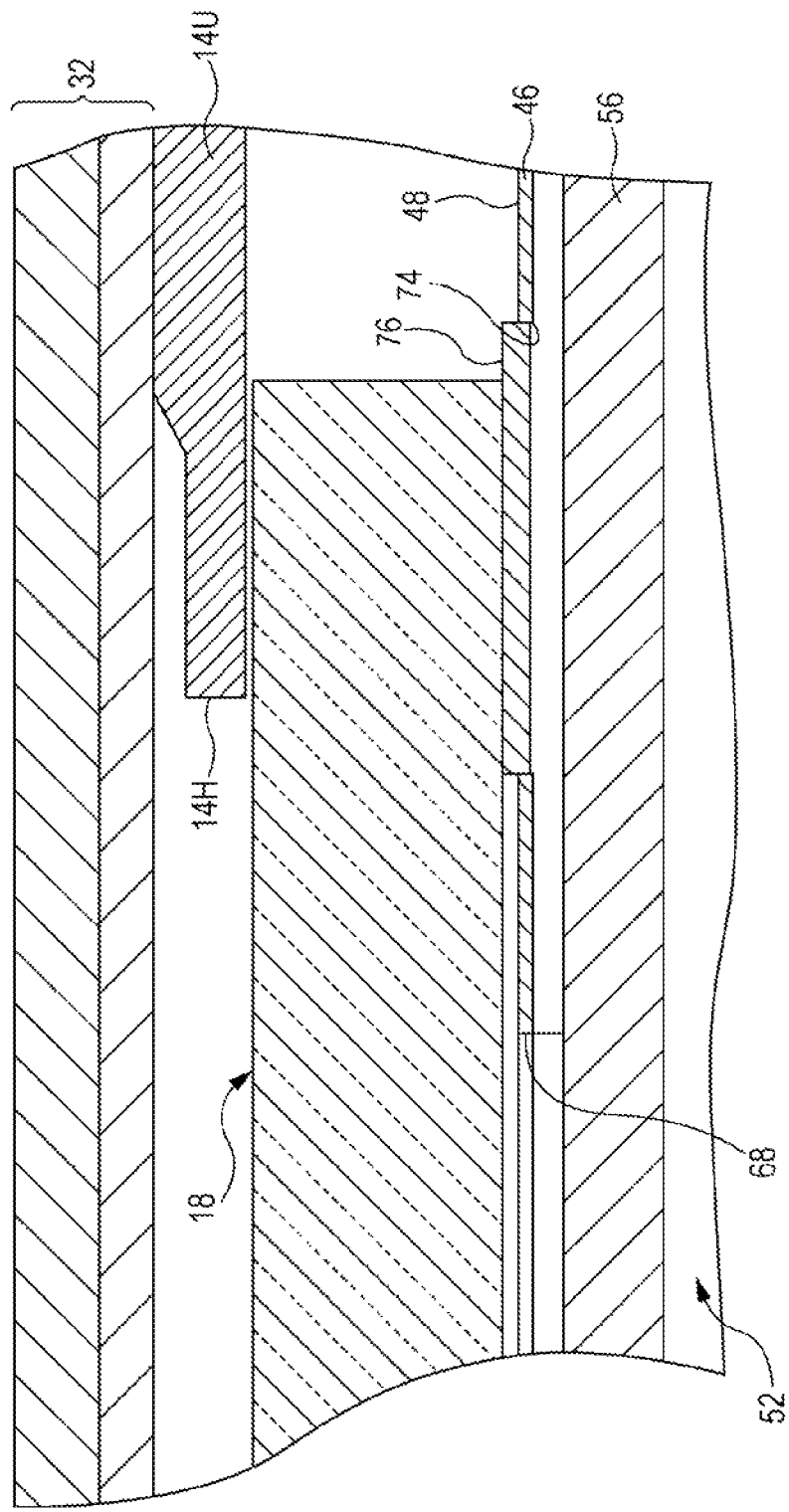
FIG. 9 is an enlarged partial sectional view of the internal structure of the mobile computer of the first embodiment taken along line IX-IX of FIG. 1.

The holder member 46 has a groove portion 74 formed therein and extending from one end to the other end thereof in the width direction (direction of arrow W). As illustrated in FIG. 9, a bezel 76 of the display 18 is fitted in the groove portion 74 in the thickness direction so as not to protrude from the holder main body portion 48 toward the card holding portion 52.

Next, the operation of the mobile computer 12 of this embodiment is described.

In the mobile computer 12, as illustrated in FIG. 3, the air blower 26 is held in a predetermined position by the air blower mounting member 24, and is attached to the enclosure 14 (lower member 14L). For example, by fixing the air blower mounting member 24 to the enclosure 14 and then disposing the air blower 26 in the frame portion 42 of the air blower mounting member 24, the air blower 26 is easily aligned relative to the enclosure 14.

The card holder 54 is disposed so as to overlap with the air blower mounting member 24 in the thickness direction. Thus, compared, for example, to a structure in which the card holder and the air blower mounting member are not arranged one on top of the other in the thickness direction and are simply arranged in the width direction (direction of arrow W) or the depth direction (direction of arrow D), the layout area in the width direction or the depth direction is small. That is, in this embodiment, the air blower 26 and the card holder 54 may be allowed to coexist in the enclosure 14, with a simple structure, while keeping the enclosure 14 from increasing in size in the width direction and the depth direction.

In particular, in this embodiment, part of the card 56 held in the card holding portion 52 partially overlaps also with the air blower 26 in plan view (view from the direction of arrow A). Therefore, compared to a structure in which the card 56 does not overlap with the air blower 26, the increase in size of the enclosure 14 in the width direction and the depth direction may be further suppressed.

In the mobile computer 12 of this embodiment, the card holder 54 has such a structure that the holder member 46 is attached to the air blower mounting member 24, and part of the air blower mounting member 24 doubles as the card holder 54 is disposed. Since part of the air blower mounting member 24 doubles as the card holder 54 is disposed, the thickness is small compared to a structure in which the card holder 54 is separate from the air blower mounting member 24 and is simply placed on top of the air blower mounting member 24. That is, in this embodiment, by reducing the thickness of the card holder 54, the thickness of the enclosure 14 may also be reduced, and the increase in size is suppressed.

In addition, the bezel 76 of the display 18 is fitted in the groove portion 74 of the holder member 46 (card holder 54) in the thickness direction. Therefore, compared to a structure in which the groove portion 74 is not formed in the holder member 46, the total thickness of the card holder 54 and the display 18 may be reduced. Thus, the thickness of the enclosure 14 may also be reduced.

In addition, in this embodiment, the card 56 held in the card holder 54 does not overlap with the battery 22 in plan view (view from the direction of arrow A), and the card 56 is located within the range of the thickness T1 of the battery 22. Since the card 56 does not overlap with the battery 22 having a predetermined thickness, the thickness of the enclosure 14 may be reduced.

As described above, part of the card 56 held in the card holding portion 52 overlaps with part of the air blower 26. However, in the relationship with the air inlets 40, the part of the card 56 only partially overlaps with one of the plurality of air inlets 40. Therefore, compared to a structure in which the card 56 overlaps with the plurality of air inlets 40 or completely overlaps with one of the plurality of air inlets 40, the influence on the air suction through the air inlets 40 is small.

In particular, in this embodiment, as can be seen in FIG. 8, the card 56 is supported by the elongated protrusions 58 so as not to be in contact with the air blower 26. Even in the air inlet 40 with which the card 56 partially overlaps in plan view, a gap is formed between the overlapping part of the air inlet 40 and the card 56 (the card 56 does not completely cover the air inlet 40), and therefore the influence on the air suction through this air inlet 40 is small.

Card supporting members are not limited to the above-described elongated protrusions 58. For example, a plurality of protrusions supporting the card 56 may dot the surface of the air blower mounting member 24 facing the holder member 46. Since the elongated protrusions 58 according to the above-described embodiment are formed along the direction of insertion of the card 56, the front edge of the card 56 does not accidentally hit the elongated protrusions 58 when the card 56 is inserted, and the card 56 may be smoothly inserted into the card holding portion 52.

When the card 56 is inserted into the card holding portion 52, as can be seen in FIG. 8, the guide walls 60 of the air blower mounting member 24 face the side edges 56E of the card 56. If the card 56 is displaced or inclined in the width direction when inserted, the guide walls 60 come into contact with the side edges 56E, and this displacement or inclination is thereby suppressed. Thus, the card 56 may be smoothly inserted into the card holding portion 52.

Although, in the above embodiment, the guide walls 60 are formed on the air blower mounting member 24, the guide walls 60 may be formed, for example, on the holder member 46 or on both the air blower mounting member 24 and the holder member 46. The guide walls may be separate from the air blower mounting member 24. However, if the guide walls are formed on the air blower mounting member 24, the increase in number of components may be suppressed.

The terminals 64 of the card input and output board 62 protrude into the card holding portion 52 when the card 56 is not held in the card holding portion 52. Therefore, when the card 56 is held in the card holding portion 52, good contact with the contact portion of the card 56 may be maintained.

When the card 56 is not held in the card holding portion 52, the terminals 64 of the card input and output board 62 protruding into the card holding portion 52 may be kept from coming into contact with the holder member 46 owing to the contact avoidance hole 68. For example, the terminals 64 may be kept from being accidentally short-circuited with each other by the holder member 46.

The card input and output board 62 and the communication module member 70 are attached to and integrated with the air blower mounting member 24. When the air blower mounting member 24 is attached to the enclosure 14, the card input and output board 62 and the communication module member 70 are also attached to the enclosure 14 at the same time. Thus, compared to a structure in which the card input and output board 62 and the communication module member 70 are separate from the air blower mounting member 24, the process of attachment to the enclosure 14 can be simplified. In addition, by removing the air blower mounting member 24 from the enclosure 14, the card input and output board 62 and the communication module member 70 can also be removed from the enclosure 14, and therefore the workability of maintenance and inspection is improved.

The terminals 64 may be separate from the card input and output board 62 and attached to the air blower mounting member 24 or the like. In this embodiment, the terminals 64 are provided on the card input and output board 62. Therefore, if the card input and output board 62 is attached to and integrated with the air blower mounting member 24, the displacement of the terminals 64 relative to the card holding portion 52 may be suppressed.

In the above-described embodiment, a centrifugal air blower is used as the air blower 26. However, the specific structure is not limited as long as the object of cooling may be cooled by blowing air to the object of cooling. However, if a centrifugal air blower is used, air is blown in the centrifugal direction of the rotation of the rotary vanes 36, and therefore the object of cooling may be disposed downstream of airflow in this centrifugal direction. That is, in consideration of the combination of the air blower 26 and the object of cooling (heat radiation member 28), the thickness may be reduced.

In the frame portion 42 of the air blower mounting member 24, the duct portion 42D is formed. Air from the air blower 26 is dispersed by the duct portion 42D in the direction in which the heat radiation fins of the heat radiation member 28 are arranged, and therefore the amount of air blown to each of the heat radiation fins may be equalized. Since the duct portion 42D is formed in the air blower mounting member 24, compared to a structure having a separate duct, the increase in number of components is suppressed.

Electronic devices are not limited to the above-described mobile computer, and may include desktop computers, single-unit computers, cell-phones, electronic dictionaries, and mobile audio and visual devices.

The structure and use of the card are not particularly limited. Cards may include a card having embedded electronic circuits and used for identification, a card from which a record such as a magnetic record or a bar code may be read, a card for adding a specific function, such as communication with an external device, to an electronic device.

Although the embodiment of the present disclosure has been described, the present disclosure is not limited to the above-described embodiment. It goes without saying that various changes may be made without departing from the spirit of the present disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic device comprising:
    an enclosure;
    an air blower disposed within the enclosure;
    an air blower mounting member for mounting the air blower within the enclosure;
    a card holder that is disposed using a part of the air blower mounting member so as to overlap with the air blower mounting member in a thickness direction and that holds a card; and
    an opening in the enclosure configured such that the card is inserted there through;
    further comprising a display, and
    a groove portion formed in the card holder in such a manner that a bezel of the display is fitted in the groove portion in the thickness direction.

2. The electronic device according to claim 1, wherein the card holder holds the card in such a manner that the card partially overlaps with the air blower in the thickness direction.

3. The electronic device according to claim 1, wherein the air blower is a centrifugal air blower that sucks in air through at least one air inlet formed in a side plate normal to a rotation axis of rotary vanes and that blows air in a centrifugal direction of the rotary vanes.

4. The electronic device according to claim 3,
    wherein the at least one air inlet comprises a plurality of air inlets, and
    the card holder holds the card in such a manner that at least a part of the plurality of air inlets does not overlap with the card in the thickness direction.

5. The electronic device according to claim 3, further comprising
    a heat radiation member cooled by air blown from the air blower, and
    a duct portion that is provided in the air blower mounting member and that disperses air blown from the air blower in a longitudinal direction of the heat radiation member.

6. The electronic device according to claim 1, further comprising a card supporting member that is provided on the air blower mounting member and that supports the card in such a manner that the card held in the card holder is not in contact with the air blower.

7. The electronic device according to claim 6, wherein the card supporting member is an elongated protrusion formed on the air blower mounting member along a direction of insertion of the card into the card holder.

8. The electronic device according to claim 1, further comprising a guide wall that is provided on at least one of the air blower mounting member and the card holder and that faces a side edge of the card inserted into the card holder and guides the insertion of the card.

9. The electronic device according to claim 1, further comprising a terminal member that has a terminal in contact with the card held in the card holder and that is attached to the air blower mounting member.

10. The electronic device according to claim 9, further comprising a contact avoidance hole that is formed in the card holder and that avoids contact of the terminal with the card holder when the card is not held in the card holder.

11. The electronic device according to claim 1, further comprising a battery disposed within the enclosure,
wherein the card is disposed so as not to overlap with the battery in the thickness direction.

\* \* \* \* \*